United States Patent [19]

Onishi

[11] Patent Number: 5,486,258
[45] Date of Patent: Jan. 23, 1996

[54] METHOD FOR BONDING SUBSTRATES WITH SILICONE RUBBER COMPRISING BOTH A THERMAL AND MOISTURE CROSSLINKING COMPONENT

[75] Inventor: Masayuki Onishi, Ichihara, Japan

[73] Assignee: Dow Corning Toray Silicone Company, Ltd., Tokyo, Japan

[21] Appl. No.: 444,339

[22] Filed: May 18, 1995

Related U.S. Application Data

[62] Division of Ser. No. 230,673, Apr. 21, 1994.

[30] Foreign Application Priority Data

May 18, 1993 [JP] Japan .................. 5-139332

[51] Int. Cl.$^6$ .............. C09J 5/06; C09J 183/04; C09J 183/14
[52] U.S. Cl. .............. 156/307.5; 156/329; 528/15
[58] Field of Search .............. 528/15; 156/329, 156/307.5

[56] References Cited

U.S. PATENT DOCUMENTS

| | | | |
|---|---|---|---|
| 4,034,140 | 7/1977 | Przybyla | 428/447 |
| 4,614,760 | 9/1986 | Homan et al. | 524/860 |
| 5,091,445 | 2/1992 | Revis | 523/212 |

FOREIGN PATENT DOCUMENTS

| | | |
|---|---|---|
| 12825 | 9/1980 | European Pat. Off. . |
| 247756 | 11/1986 | Japan . |
| 252456 | 11/1987 | Japan . |

OTHER PUBLICATIONS

European Search Report dated Sep. 14, 1994.

*Primary Examiner*—John C. Bleutge
*Assistant Examiner*—D. R. Wilson
*Attorney, Agent, or Firm*—Roger H. Borrousch

[57] ABSTRACT

A method for bonding substrates with silicone rubber substantially shortens the setting time and provides good bonding of the substrates with silicone rubber using a silicone rubber composition comprised of a thermal-crosslinking component and moisture-crosslinking component. The silicone composition is applied to a substrate, heated to give a silicone gel, subsequently brought into contact with another substrate, and is followed by moisture crosslinking to form a silicone rubber.

1 Claim, No Drawings

METHOD FOR BONDING SUBSTRATES WITH SILICONE RUBBER COMPRISING BOTH A THERMAL AND MOISTURE CROSSLINKING COMPONENT

This is a divisional of copending application Ser. No. 08/230,673 filed on mar. 21, 1994.

BACKGROUND OF THE INVENTION

1. Technical Field

This invention relates to methods for bonding or adhering substrates using silicone rubber. More specifically, with regard to the bonding of two substrates using a silicone rubber composition comprised of a thermal-crosslinking component and a moisture-crosslinking component, the present invention relates to such silicone rubber bonding methods that are capable of substantially reducing the setting time and firmly bonding the substrates.

2. Prior Art

Moisture-crosslinking silicone rubber compositions can be crosslink at room temperature under the action of atmospheric moisture. When this type of composition is crosslinked and cured while in contact with a substrate, it is capable of yielding silicone rubber that tightly bonds a variety of substrates. As a result of these attributes, moisture-crosslinking silicone rubber compositions are used for adhesion applications in the very broadest range of industrial fields, for example, in the construction industry for adhering window glass to aluminum frames, for adhering window glass to window glass, and for adhering tile and mortar; in the automotive industry for sealing oil pans to engine bodies, for bonding automotive electrical circuit components on substrates, for bonding lamp bodies with lamp glass, and for bonding automotive glass to the automobile body; and in electrical/electronic sectors for adhering electronic circuit components to substrates.

Moisture-crosslinking silicone rubber compositions are exemplified by silicone rubber compositions comprised of silanol-terminated polydiorganosiloxane, curing catalyst, and organotrialkoxysilane, organotriacetoxysilane, or organotrioximosilane, and by silicone rubber compositions comprised of trialkoxysiloxy-terminated polydiorganosiloxane, curing catalyst, and organotrialkoxysilane, organotriacetoxysilane, or organotrioximosilane, such as shown in Japanese Patent Application Laid Open [Kokai or Unexamined] Numbers Sho 61-247756 [247,756/1986], published Nov. 5, 1986, and Sho 62-252456 [252,456/1987], published Nov. 4, 1987, both assigned to the same assignee as the present application.

However, crosslinking in moisture-crosslinking silicone rubber compositions develops from those regions in contact with atmospheric moisture, and as a result long periods of time are required for crosslinking in deep sections. More specifically, the corresponding requirement for long setting times is a drawback associated with the use of this type of composition in continuous processes for bonding two substrates. The setting time is the time required for crosslinking to develop to such a degree that the adherends can tolerate transport and other handling and can be transferred to ensuing processes. In contrast, thermal-crosslinking silicone rubber compositions can be rapidly crosslinked even in deep sections by heating and are therefore used as molding materials, potting materials, and the like.

Thermal-crosslinking silicone rubber compositions are exemplified by addition reaction-crosslinking silicone rubber compositions comprised of a polydiorganosiloxane that has at least 2 alkenyl groups in each molecule, an organopolysiloxane that has at least 2 silicon-bonded hydrogen in each molecule, and a hydrosilylation catalyst. Peroxide-crosslinking silicone rubber compositions comprised of polydiorganosiloxane and organoperoxide are another example of thermal-crosslinking silicone rubber compositions.

However, these thermal-crosslinking silicone rubber compositions generally have poor adhesive properties. In the case of continuous operations in which two substrates are bonded using this type of composition, the adhesion process is complicated by the resulting requirement for a preliminary primer treatment of the substrates.

In an effort to improve the adhesive properties of thermal-crosslinking silicone rubber compositions, silicone rubber compositions comprised of a thermal-crosslinking component and a moisture-crosslinking component have been proposed. One example of this type of silicone rubber composition is a silicone rubber composition prepared by blending a moisture-crosslinking silicone rubber composition comprised of silanol-terminated polydiorganosiloxane and organotriacetoxysilane to homogeneity with a thermal-crosslink-ing silicone rubber composition comprised of organopolysiloxane and organoperoxide as shown by Przybyla in U.S. Pat. No. 4,034,140, issued Jul. 5, 1977. Another example is a silicone rubber composition comprised of silanol-terminated polydiorgano-siloxane, amidosilane, and organoperoxide as shown by Homan et al in U.S. Pat. No. 4,614,760, issued Sep. 30, 1986.

However, several drawbacks still occur during the continuous bonding of two substrates with silicone rubber compositions composed of a thermal-crosslinking component and a moisture-crosslinking component. Specifically, long setting times and an unsatisfactory adhesion between substrate and silicone rubber occur in the case of conventional adhesion methods, for example, application of the composition to substrate followed by formation of silicone rubber by heating the composition.

The inventor carried out extensive investigations in order to solve the problems described above and achieved the present invention as a result.

SUMMARY OF THE INVENTION

With regard to the adhesion or bonding of two substrates using a silicone rubber composition comprised of a thermal-crosslinking component and a moisture-crosslinking component, the present invention takes as its object the introduction of a method for bonding substrates with silicone rubber that is able to substantially shorten the setting time and that is also able to firmly adhere the substrates to each other through the silicone rubber.

Means Solving the Problems and Function Thereof

One embodiment of this invention relates a method for bonding substrates with silicone rubber comprising coating a substrate with a silicone rubber composition comprising a thermal-crosslinking component and a moisture-crosslinking component, then heating the silicone rubber composition to give a silicone gel, then subsequently bringing another substrate into contact with the silicone gel, and finally forming a silicone rubber by moisture-crosslinking the silicone gel.

Another embodiment of this invention relates to a method for bonding substrates with silicone rubber comprising filling a space between two substrates with a silicone rubber composition that comprises a thermal-crosslinking component and a moisture-crosslinking component, then heating the silicone rubber composition to give a silicone gel, and finally forming a silicone rubber by moisture-crosslinking the silicone gel.

DETAILS OF THE EMBODIMENTS OF THIS INVENTION

Insofar as concerns the aforesaid silicone rubber composition comprised of a thermal-crosslinking component and moisture-crosslinking component, no specific restrictions obtain on this composition with regard to execution of the bonding methods of the present invention. The subject silicone rubber composition is exemplified by the silicone rubber composition described by Przybyla comprising the homogeneous blend of a moisture-crosslinking silicone rubber composition comprised of silanol-terminated polydiorganosiloxane and organotriacetoxysilane and a thermal-crosslinking silicone rubber composition composed of organopolysiloxane and organoperoxide. Another example is the silicone rubber composition described by Homan et al comprising silanol-terminated polydiorganosiloxane, amidosilane, and organoperoxide. Both Przybyla (U.S. Pat. No. 4,034,140) and Homan et al (U.S. Pat. No. 4,614,760) are hereby incorporated by reference to show silicone rubber compositions useful for this inventive method.

The silicone rubber composition can also exemplified by other homogeneous blends prepared from a moisture-crosslinking silicone rubber composition plus a thermal-crosslinking silicone rubber composition. Said moisture-crosslinking silicone rubber compositions are exemplified by the combination of silanol-terminated polydiorganosiloxane, curing catalyst, and organotrialkoxysilane, organotriacetoxysilane, or organotrioximosilane; by the combination of trialkoxysiloxy-terminated polydiorganosiloxane, curing catalyst, and organotrialkoxysilane, organotriacetoxysilane, or organotrioximosilane; and so forth. The aforesaid thermal-crosslinking silicone rubber compositions are exemplified by peroxide-crosslinking silicone rubber compositions comprised of polydiorganosiloxane and organoperoxide; by addition reaction-crosslinking silicone rubber compositions comprised of polydiorganosiloxane that has at least 2 alkenyl groups in each molecule, organopolysiloxane that has at least 2 silicon-bonded hydrogen in each molecule, and hydrosilylation catalyst; and so forth. The subject silicone rubber composition may take the form of a single-package or two-package composition or may be divided up into an even greater number of fractions. The multipackage silicone rubber compositions are preferably mixed immediately prior to use. In addition, the silicone rubber composition under consideration may contain inorganic filler, e.g., fumed silica, crystalline silica, calcined silica, wet-process silica, titanium oxide, etc.; pigment such as carbon black, iron oxide, etc.; flame retardant; heat stabilizer; and so forth.

Many substrates can be bonded with silicone rubber in accordance with the bonding methods of the present invention. Operable substrates are exemplified by inorganic substrates such as glass, pottery, porcelain, ceramics, mortar, concrete, slate, and so forth; by metal substrates such as copper, aluminum, iron, stainless steel, and so forth; by organic substrates such as polycarbonate resin (PC resin), polyarylate resin (PAR resin), polystyrene resin, polyester resin, polybutylene resin, acrylic resin, methacrylic resin, phenolic resin, epoxy resin, polybutylene terephthalate resin (PBT resin), polyphenylene oxide resin, polyphenylene sulfide resin (PPS resin), polyamide resin, acrylonitrile/butadiene/styrene copolymer resin (ABS resin), polyimide resin, natural rubber, synthetic rubber, silicone rubber, and so forth; and by moldings coated with the preceding substrates, e.g., electronic components such as condensers, resistors, resin-sealed semiconductor elements, and so forth. The bonding methods of the present invention are highly suitable for the bonding of heat-labile organic substrates, for example, for bonding organic substrates such as polycarbonate resin (PC resin), acrylic resin, methacrylic resin, polyphenylene sulfide resin (PPC resin), etc., or moldings coated with such materials.

In the bonding method of the first embodiment, a substrate is first coated with the silicone rubber composition comprised of a thermal-crosslinking component and a moisture-crosslinking component. Many methods for applying the silicone rubber composition to the substrate can be used, and examples include extrusion from a tube or cartridge, application from a dispenser, and so forth.

The silicone rubber composition coated on the substrate is then heated to form a silicone gel. The heating temperature for silicone gel production is any temperature sufficient to yield a silicone gel from the composition. Specifically, temperatures in the range of 40° C. to 200° C. are preferred and temperatures in the range of 80° C. to 150° C. are particularly preferred when the composition contains alkenyl-containing organopolysiloxane, SiH-containing organopoly-siloxane, and hydrosilylation catalyst. Temperatures in the range of 80° C. to 250° C. are preferred and temperatures in the range of 100° C. to 200° C. are particularly preferred when the composition contains organoperoxide. Heating methods are exemplified by (a) holding the composition-coated substrate in a circulation oven; and (b) irradiating the composition-coated substrate with far-infrared radiation.

With regard to the silicone gel obtained by heating the silicone rubber composition in the execution of the bonding method of the first embodiment, the physical properties of this silicone gel are such that a silicone gel lacking fluidity is obtained. However, physical properties specifically preferred for this silicone gel are those having a consistency (¼ cone) in accordance with JIS K 2220 in the range of 10 to 150 and a penetration in accordance with JIS K 2207 in the range of 10 to 600.

A second substrate is then brought into contact with the silicone gel, which results in the second substrate being held or retained on the first substrate by the silicone gel. As a consequence, the adherends become capable of withstanding transport and other handling during moisture-crosslinking of the silicone gel, and shifts in the bonding position of the adherends and their delamination will be suppressed even when the silicone gel or adherends are subjected to external stresses.

Finally, the silicone gel sandwiched between the substrates is crosslinked by moisture to yield silicone rubber. The conditions for crosslinking the silicone gel are, for example, standing at room temperature in the presence of moisture will suffice, and while special equipment is not required, crosslinking of the silicone gel can be accelerated by placing it within a device capable of maintaining elevated temperatures and high humidities.

The physical properties of the silicone rubber afforded by crosslinking of the silicone gel are such that the silicone rubber is simply sufficient to manifest physical properties at a level such that it can bond and hold the substrates. A specifically preferred physical property for the silicone rubber is a hardness according to JIS K 6301 in the range of 4 to 80 (spring method, type A).

In the execution of the bonding method in accordance with the second embodiment, the silicone rubber composition comprised of thermal-crosslinking component and moisture-crosslinking component is first filled into a space between two substrates. The method for filling the composition between the substrates is exemplified by extrusion from a tube or cartridge, application from a dispenser, and so forth.

The silicone rubber composition filled between the substrates is then heated to yield a silicone gel. The heating temperature for silicone gel production is the same as described above for the first embodiment and the preferred physical properties of the silicone gel are the same as described above for the first embodiment.

The adherends are at this point in the bonding method of the second embodiment capable of withstanding transport and other handling during moisture-crosslinking of the silicone gel, and shifts in the bonding position of the adherends and their delamination will be suppressed even when the silicone gel or adherends are subjected to external stresses.

Finally, the silicone gel sandwiched between the substrates is crosslinked by moisture to yield silicone rubber. The conditions for crosslinking the silicone gel are the same as described for the first embodiment and the preferred physical properties of the silicone rubber are the same as described for the first embodiment.

The bonding methods in accordance with the present invention make possible a substantial shortening of the setting time and provide good bonding of the substrates with silicone rubber in the process of bonding substrates using a silicone rubber composition comprised of a thermal-crosslinking component and moisture-crosslinking component. As a result, the bonding methods in accordance with the present invention provide major improvements in productivity when used in continuous bonding processes in the electrical/electronic information-processing equipment industry, machine industry, automobile industry, rubber/plastics industry, fiber/fabric industry, and medical instrument industry.

The bonding methods of the present invention will be explained in greater detail hereinafter through working examples. The viscosities reported in the examples were measured at 25° C. The penetration of the silicone gel, the hardness of the silicone rubber, and the adhesive properties (adhesive strength and adherence) of the silicone rubber were measured as follows.

Penetration of the silicone gel: measured in accordance with the penetration test method stipulated in JIS K 2207.

Hardness of the silicone rubber: measured used a spring-type hardness tester (type A) as stipulated in JIS K 6301.

Adhesive strength of the silicone rubber: the adhesive strength of the silicone rubber against aluminum sheet was measured by the lap shear test stipulated in JIS K 6850.

Adherence of the silicone rubber: the status of the silicone rubber was visually inspected after execution of the lap shear test stipulated in JIS K 6850 and was rated on the following scale:

++cohesive rupture of the silicone rubber

+partial cohesive rupture of the silicone rubber

×interfacial delamination

Reference Example 1

The following were added to a mixture of 50 weight parts trimethoxysiloxy-terminated polydimethylsiloxane having a viscosity of 15 Pa.s and 50 weight parts dimethylvinylsiloxy-terminated polydimethylsiloxane having a viscosity of 12 Pa.s: 10 weight parts dry-method silica (BET specific surface=110 m$^2$/g) whose surface had been treated with hexamethyldisilazane, 1 weight part trimethylsiloxy-terminated dimethylsiloxane-methylhydrogensiloxane copolymer (viscosity=0.010 Pa.s, silicon-bonded hydrogen content=0.7 weight%), sufficient isopropanolic chloroplatinic acid solution to provide 10 ppm platinum metal referred to the dimethylvinylsiloxy-terminated polydimethylsiloxane, 2 weight parts methyltrimethoxysilane, and 1 weight part tetrabutyl titanate. The resulting mixture was mixing to homogeneity while excluding moisture to obtain silicone rubber composition (I).

Silicone rubber composition (I) was held in a circulation oven at 100° C. (atmosphere=dry nitrogen) for 60 minutes to yield a silicone gel, and the penetration of this silicone gel was then measured. The hardness was also measured on the silicone rubber generated by holding this silicone gel for an additional 7 days at 20° C./55% RH. These results were as reported in Table 1.

Reference Example 2

The following were added to a mixture of 70 weight parts methyldimethoxysiloxy-terminated polydimethylsiloxane having a viscosity of 12 Pa.s and 30 weight parts dimethylvinyl- siloxy-terminated polydimethylsiloxane having a viscosity of 12 Pa.s: 30 weight parts quartz powder, 1 weight part 2,4-dichlorobenzoyl peroxide, 2 weight parts methyltrimethoxysilane, and 0.3 weight parts diisopropoxybis(ethyl acetoacetate)-titanium. The resulting mixture was mixed, excluding moisture, to homogeneity to obtain silicone rubber composition (II).

Silicone rubber composition (II) was held in a circulation oven at 120° C. (atmosphere=dry nitrogen) for 30 minutes to yield a silicone gel, and the penetration of this silicone gel was then measured. The hardness was also measured on the silicone rubber generated by holding this silicone gel for an additional 7 days at 20° C. /55% RH. These results were as reported in Table 1.

Reference Example 3

The following were added to a mixture of 50 weight parts trimethylsiloxy-terminated polydimethylsiloxane having a viscosity of 12 Pa.s and 50 weight parts dimethylvinylsiloxy-terminated polydimethylsiloxane having a viscosity of 12 Pa.s, 10 weight parts dry-method silica (BET specific surface=110 m$^2$/g) whose surface had been treated with hexamethyldisilazane, 1 weight part trimethylsiloxy-terminated dimethylsiloxane-methylhydrogensiloxane copolymer (viscosity=0.010 Pa.s, silicon-bonded hydrogen content=0.7 weight%), sufficient isopropanolic chloroplatinic acid solution to provide 10 ppm platinum metal referred to the dimethylvinylsiloxy-terminated dimethylpolysiloxane, 2 weight parts methyltrimethoxysilane, and 1 weight part tetrabutyl titanate. The resulting mixture was mixed to homogeneity while excluding moisture to obtain silicone rubber composition (III).

Silicone rubber composition (III) was held in a circulation oven at 100° C. (atmosphere=dry nitrogen) for 60 minutes to yield a silicone gel, and the penetration of this silicone gel was then measured. The hardness was also measured on the silicone rubber generated by holding this silicone gel for an additional 7 days at 20° C./55% RH. These results are reported in Table 1.

Reference Example 4

The following were added to a mixture of 50 weight parts trimethoxysiloxy-terminated polydimethylsiloxane having a viscosity of 15 Pa.s and 50 weight parts trimethylsiloxy-terminated polydimethylsiloxane having a viscosity of 12 Pa.s: 10 weight parts dry-method silica (BET specific surface=110 m$^2$/g) whose surface had been treated with hexamethyldisilazane, 1 weight part trimethylsiloxy-terminated dimethylsiloxane-methylhydrogensiloxane copolymer (viscosity=0.010 Pa.s, silicon-bonded hydrogen content=0.7 weight %), sufficient isopropanolic chloroplatinic acid solution to provide 10 ppm platinum metal referred to the trimethylsiloxy-terminated polydimethylsiloxane, 2 weight parts methyltrimethoxysilane, and weight part tetrabutyl titanate. The resulting mixture was mixed to homogeneity while excluding moisture to obtain silicone rubber composition (IV).

Silicone rubber composition (IV) was held in a circulation oven at 100° C. (atmosphere=dry nitrogen) for 60 minutes to yield a silicone gel, and the penetration of this silicone gel was then measured. The hardness was also measured on the silicone rubber generated by holding this silicone gel for an additional 7 days at 20° C. /55% RH. These results were as reported in Table 1.

TABLE 1

| SILICONE RUBBER COMPOSITION | I | II | III | IV |
|---|---|---|---|---|
| Penetration after curing only by heating | 50 | 80 | 45 | cured only at surface |
| Hardness after curing by heating and moisture | 20 | 16 | 1 | 1 |
| Hardness after curing only by moisture | 12 | 1 | 1 | 1 |

EXAMPLE 1

Silicone rubber composition (I) as prepared in Reference Example 1 was coated on an aluminum sheet. This was then held for 60 minutes in a circulation oven at 100° C. under a dry nitrogen atmosphere to form silicone gel on the aluminum sheet. Substrates as reported in Table 2 were subsequently applied to the surface of the silicone gel. In each case the substrate was bonded to the silicone gel and could not be readily delaminated from the silicone gel or knocked out of position. The substrate and aluminum sheet were bonded with silicone rubber by holding the particular assembly (substrate held on the aluminum sheet by the silicone gel) at 20° C. /55% RH for 7 days. The adhesive strength and adherence between the aluminum sheet and substrate due to the silicone rubber were then respectively measured, and these results were as reported in Table 2.

Comparison Example 1

Silicone rubber composition (I) as prepared in Reference Example 1 was coated on aluminum sheet, and substrates as reported in Table 2 were then respectively applied to the surface of the silicone rubber composition. The substrate and aluminum sheet were bonded with silicone rubber by holding the particular assembly (substrate held on the aluminum sheet by the silicone rubber composition) at 20° C./55% RH for 7 days. Bonding occurred in some cases with the substrate having been knocked out of position on the aluminum sheet during transport or curing. The adhesive strength and adherence between the aluminum sheet and substrate due to the silicone rubber were then respectively measured, and these results were as reported in Table 2.

EXAMPLE 2

Silicone rubber composition (I) as prepared in Reference Example 1 was filled between aluminum sheet and substrate (substrates reported in Table 2), and silicone gel was produced by holding the silicone rubber composition filled between the aluminum sheet and substrate for 60 minutes in a circulation oven at 100° C. under a dry nitrogen atmosphere. In each case the substrate was bonded to the silicone gel and could not be readily delaminated from the silicone gel or knocked out of position. The substrate and aluminum sheet were bonded by silicone rubber by holding the particular assembly (substrate held on the aluminum sheet by the silicone gel) at 20° C./55% RH for 7 days. The adhesive strength and adherence between the aluminum sheet and substrate due to the silicone rubber were then respectively measured, and these results were as reported in Table 2.

Comparison Example 2

Silicone rubber composition (III) as prepared in Reference Example 3 was filled between aluminum sheet and substrate (substrates reported in Table 2), and silicone gel was produced by holding the silicone rubber composition filled between the aluminum sheet and substrate for 60 minutes in a circulation oven at 100° C. under a dry nitrogen atmosphere. In each case the substrate was bonded to the silicone gel and could not be readily delaminated from the silicone gel or knocked out of position. However, curing did not proceed any further when the particular assembly (substrate held on the aluminum sheet by the silicone gel) was held at 20° C./55% RH for 7 days. The adhesive strength and adherence between the aluminum sheet and substrate due to the silicone gel were then respectively measured, and these results were as reported in Table 2.

Comparison Example 3

Silicone rubber composition (IV) as prepared in Reference Example 4 was filled between aluminum sheet and substrate (substrates reported in Table 2). Curing did not occur, however, when the silicone rubber composition filled between the aluminum sheet and substrate was held for 60 minutes in a circulation oven at 100° C. under a dry nitrogen atmosphere. The substrate and aluminum sheet were adhered by silicone rubber by holding the substrate at 20° C./55% RH for 7 days. However, adhesion occurred in some cases with the substrate having been knocked out of position on the aluminum sheet during transport or curing. The adhesive strength and adherence between the aluminum sheet and substrate due to the silicone rubber were then respectively measured, and these results were as reported in Table 2.

EXAMPLE 3

Silicone rubber composition (II) as prepared in Reference Example 2 was filled between aluminum sheet and substrate (substrates reported in Table 2), and silicone gel was produced by holding the silicone rubber composition filled between the aluminum sheet and substrate for 30 minutes in a circulation oven at 120° C. under a dry nitrogen atmosphere. In each case the substrate was bonded to the silicone gel and could not be readily delaminated from the silicone gel or knocked out of position. The substrate and aluminum sheet were adhered by silicone rubber by holding the particular assembly (substrate held on the aluminum sheet by the silicone gel) at 20° C./55% RH for 7 days. The adhesive strength and adherence between the aluminum sheet and substrate due to the silicone rubber were then respectively measured, and these results were as reported in Table 2.

EXAMPLE 4

Silicone rubber composition (II) as prepared in Reference Example 2 was coated on aluminum sheet. This was then held for 30 minutes in a circulation oven at 120° C. under a dry nitrogen atmosphere to form silicone gel on the aluminum sheet. Substrates as reported in Table 2 were then respectively applied to the surface of the silicone gel. In each case the substrate was bonded to the silicone gel and could not be readily delaminated from the silicone gel or knocked out of position. The substrate and aluminum sheet were adhered by silicone rubber by holding the particular assembly (substrate held on the aluminum sheet by the silicone gel) at 20° C. /55% RH for 7 days. The adhesive strength and adherence between the aluminum sheet and substrate due to the silicone rubber were then respectively measured, and these results were as reported in Table 2.

Comparison Example 4

Silicone rubber composition (II) as prepared in Reference Example 2 was filled between aluminum sheet and substrate (substrates reported in Table 2). The aluminum sheet and substrate were adhered by silicone rubber by holding the silicone rubber composition filled between the aluminum sheet and substrate for 7 days at 20° C./55% RH. Adhesion occurred in some cases with the substrate having been knocked out of position on the aluminum sheet during transport or curing. The adhesive strength and adherence between the aluminum sheet and substrate due to the silicone rubber were then respectively measured, and these results were as reported in Table 2.

Comparison Example 5

Specimens prepared as in Comparison Example 4 (assembly of aluminum sheet and substrate adhered by silicone rubber) were additionally held for 30 minutes in a circulation oven at 120° C. The adhesive strength and adherence between the aluminum sheet and substrate due to the silicone rubber were then respectively measured, and these results were as reported in Table 2.

TABLE 2

|  | Invention Examples | | | | Comparison Examples | | | | |
| --- | --- | --- | --- | --- | --- | --- | --- | --- | --- |
|  | Example 1 | Example 2 | Example 3 | Example 4 | Comp. Ex. 1 | Comp. Ex. 2 | Comp. Ex. 3 | Comp. Ex. 4 | Comp. Ex. 5 |
| Adhesive strength (kgf/cm²) | 10 | 11 | 9 | 8 | 5 | 4 | 3 | 5 | 7 |
| Adherence: Substrate: |  |  |  |  |  |  |  |  |  |
| Aluminum sheet | ++ | ++ | ++ | ++ | + | x | + | + | ++ |
| Stainless steel sheet | ++ | ++ | ++ | ++ | x | x | x | x | x |
| Glass sheet | ++ | ++ | ++ | ++ | ++ | x | ++ | ++ | ++ |
| PC resin sheet* | ++ | ++ | ++ | ++ | x | x | x | x | x |
| PPS resin sheet* | ++ | ++ | ++ | ++ | x | x | x | x | x |

*PC resin sheet = sheet of polycarbonate resin
PPS resin sheet = sheet of polyphenylene sulfide resin Effects of the Invention The bonding methods of the present invention are characterized by their ability to substantially shorten the setting time and provide good bonding of the substrates with silicone rubber in the process of bonding substrates using a silicone rubber composition comprised of a thermal-crosslinking component and moisture-crosslinking component.

That which is claimed is:

1. A method for bonding substrates with silicone rubber comprising coating a substrate with a silicone rubber composition comprising a thermal-crosslinking component that is an addition reaction-crosslinking silicone rubber composition comprising a polydiorganosiloxane that has at least 2 alkenyl groups in each molecule, an organosiloxane that has at least 2 silicon-bonded hydrogen in each molecule, and a hydrosilylation catalyst, and a moisture-crosslinking component comprising a combination of trialkoxysiloxy-terminated polydiorganosiloxane, curing catalyst, and organotrialkoxysilane, where the thermal-crosslinking component and moisture-crosslinking component are present in amounts such that heating the silicone rubber composition results in a silicone gel with a penetration of 10 to 600 according to JIS K 2207, and the silicone gel cures to a moisture cured silicone rubber with a hardness of 4 to 80 according to JIS K 6301 using the spring type A method, then heating the silicone rubber composition to give a silicone gel, then subsequently bringing another substrate into contact with the silicone gel, and finally forming a silicone rubber by moisture-crosslinking the silicone gel.

* * * * *